US005627495A

United States Patent [19]
Halbert et al.

[11] Patent Number: 5,627,495
[45] Date of Patent: May 6, 1997

[54] TOPOGRAPHY FOR INTEGRATED CIRCUIT OPERATIONAL AMPLIFIER

[75] Inventors: Joel M. Halbert; Kenneth W. Murray, both of Tucson, Ariz.

[73] Assignee: Burr-Brown Corporation, Tucson, Ariz.

[21] Appl. No.: 534,039

[22] Filed: Sep. 26, 1995

[51] Int. Cl.$^6$ .................................................. H03F 1/30
[52] U.S. Cl. ...................... 330/307; 330/256; 330/266; 330/289
[58] Field of Search ................................. 330/256, 266, 330/272, 289, 307

[56] References Cited

U.S. PATENT DOCUMENTS

| | | | |
|---|---|---|---|
| 3,383,614 | 5/1968 | Emmons et al. | 330/307 X |
| 3,729,660 | 4/1973 | Maidique | 330/256 X |

OTHER PUBLICATIONS

De Kok et al., "Monolithic Instrumentation Amplifier", *Electrical Engineering*, vol. 3, No. 3, Jul. 1978, pp. 225–236.

Primary Examiner—James B. Mullins
Attorney, Agent, or Firm—Cahill, Sutton & Thomas P.L.C.

[57] ABSTRACT

A high speed integrated circuit operational amplifier chip having first, second, third and fourth successive edges includes a thermal centerline parallel to the second and fourth edges. An output driver circuit is located adjacent to an output bonding pad along the third edge and is disposed approximately symmetrically about the thermal centerline to provide approximately balanced differential heating of the operational amplifier chip relative to the thermal centerline. A low gain differential input circuit is located adjacent to the first edge and is disposed approximately symmetrically about the thermal centerline to provide approximately balanced responses of matched transistors in the low gain differential input circuit to isotherms produced by the differential heating. Low gain amplification circuit transistors are located adjacent to the low gain differential input circuit and disposed along the thermal centerline between the low gain differential input circuit and the output drive circuit stage to provide approximately balanced response to the low gain amplification circuit transistors to differential heating by the output driver circuit. Compensated bias current circuitry is located along the fourth edge and adjacent to the low gain amplification circuit transistors and the output driver circuit.

14 Claims, 7 Drawing Sheets

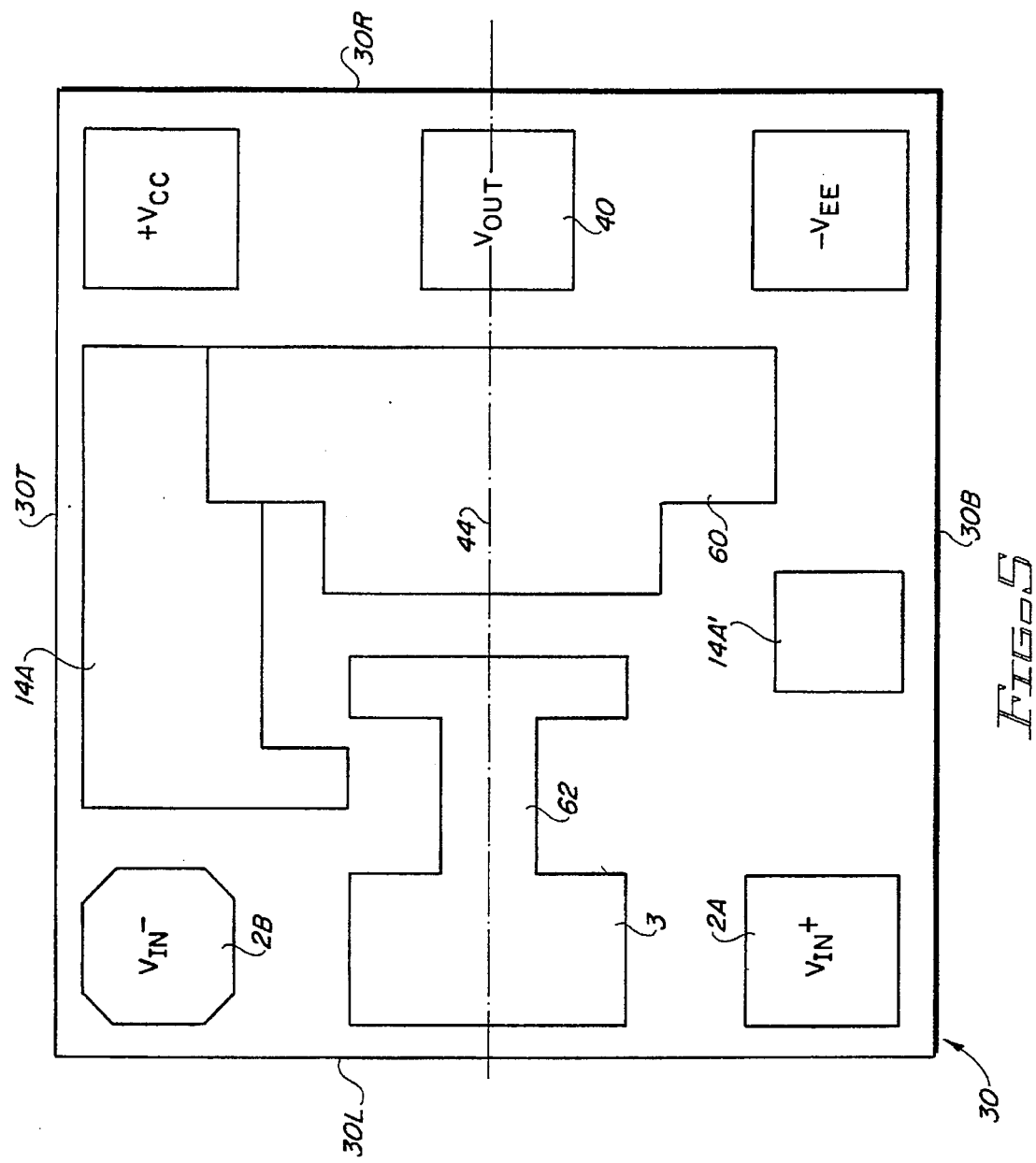

TOPOGRAPHY FOR INTEGRATED CIRCUIT OPERATIONAL AMPLIFIER

BACKGROUND OF THE INVENTION

The invention relates to an integrated circuit topography for a high speed operational amplifier.

By way of background regarding topography of integrated circuit chips, the size of an integrated circuit chip is an important factor in the ultimate cost to the final user. Another important factor is the engineering and design cost. Increasing the number of chips which are included on each wafer reduces the manufacturing cost per chip because the cost of each wafer is approximately constant. The chip size becomes an increasingly dominant factor in the ultimate product cost as the manufacturing volume increases. On each chip there are many conductive lines, some composed of aluminum or other metalization, on one or more insulative layers. Other conductors are composed of diffused regions within the silicon material of the chip. For some processes, polycrystalline silicon layers form some of the conductors. The various conductors interconnect the various electrodes of various circuit elements such as lateral PNP transistors, vertical NPN and PNP transistors, diffused resistors, thin film resistors, and metal capacitors all of which are formed using conventional bipolar manufacturing wafer fabrication processes. Specified line widths and spacings between the respective conductors and circuits element parts on each insulative layer must be maintained to avoid short circuits therebetween and to limit various parasitic effects. There often are variations in the manufacturing process parameters due to machine calibration errors and minute particulates that are invariably present in a semiconductor processing facility, and the presence of such variations dictates that the specified widths and spacings be adhered to. Furthermore, the conductor lengths, and hence their associated capacitances and resistances, must be minimized not only to reduce chip size, but also to achieve maximum circuit operating speed.

Those skilled in the art of integrated circuit chip design know that there are a number of design tradeoffs, including the desirability of minimizing chip size, obtaining suitable chip aspect ratios, increasing circuit operating speed, reducing power consumption, and avoiding various undesirable thermal effects. Such thermal effects can be due to localized DC and transient power dissipation by various transistors on the chip and also due to the sensitivity of other transistors on the chip to such thermal effects. More specifically, some of the numerous design constraints faced by the chip designer include specifications for minimum widths and spacings of diffused regions in the silicon, the minimum sizes required for contact openings between the insulating field oxide, the spacings required between edges of contact openings to edges of diffused regions, minimum widths and spacings of metal conductors, the availability or nonavailability of multiple metalization layers and conductive vias interconnecting the various layers, and the constraint that conductors on the same "layer" of the chip cannot cross one another. The large amount of capacitance associated with diffused regions must be carefully considered by the circuit designer and the chip designer in arriving at an optimum chip topography. The practically infinite number of possibilities for routing the various conductors and placement of the various transistors, resistors and capacitors on an integrated circuit taxes the skill and ingenuity of even the most resourceful chip designers and circuit designers and is beyond the capability of the most sophisticated computer layout programs yet available.

Other constraints faced by the chip designer and the circuit designer involve the need to minimize cross-coupling and parasitic effects which occur between various conductive lines and conductive regions. Such effects may degrade voltages on various conductors, leading to inoperative circuitry, reduced performance or low reliability operation under certain operating conditions.

Often, the technical and commercial success of an integrated circuit chip may hinge on the ability of the "chip designer" or "layout designer" to achieve an optimum circuit topography, and often that topography is only obtained as a result of a great deal of interaction between the circuit designers and the layout designers and careful balancing of the above tradeoffs.

Thus, those skilled in the art know that a very high level of creative interaction between the circuit designer and the chip designer or layout draftsman may be required to achieve a chip topography or layout that enables the integrated circuit to have acceptably high operating speed, acceptably low power dissipation, acceptable immunity from differential or transient thermal conditions in the chip, and yet is sufficiently small in size to be economically advantageous.

By way of background regarding good thermal design of an integrated circuit, thermal design of a bipolar integrated circuit chip requires careful consideration of the locations of transistors that when operated produce significant "differential heating" of localized regions of the chip. Good thermal design of the chip also requires careful consideration of the locations of transistors the operation of which are significantly affected by such differential heating. Good thermal design of a chip generally involves determination of the location of a "thermal centroid" of a transistor or group of transistors which produce significant differential heating effects, and then locating such transistor or group of transistors so that its thermal centroid lies on a preestablished "thermal centerline" of the chip. Similarly, thermal centroids of heat sensitive transistors, herein called "heat receptors", or groups of such heat receptor transistors should be located on the thermal centerline of the chip, or should be located as far away as possible from the source of significant differential heating effects. Failure to provide good thermal design of a chip may result in reliability problems, offset problems, linearity problems, and/or otherwise unacceptable circuit performance as a result of unbalanced differential heating of transistors which are in the main signal path or in critical bias circuits.

These considerations, in addition to the requirements mentioned above, add considerably to the challenge of providing an overall chip topography which is optimum from the various viewpoints of reliable, high speed, low power operation. In general, transistors which carry low level signals should be located symmetrically with respect to the thermal centerline of the chip so that they are equally affected by transient thermal effects produced by other transistors on the chip, which also should be located symmetrically with respect to the thermal centerline. Generally, a transistor that has a substantial collector voltage swing has a possibility of being a substantial differential heat generator, and its location must be carefully considered with respect to any transistors in the signal path which might be affected by transient temperature changes of its emitter-base junction.

For these reasons, it is typical in operational amplifier integrated chip layouts to prevent some of the possible differential thermal effects from increasing the amplifier input offset, affecting the open loop gain, and affecting the amplifier linearity by establishing a thermal centerline of the chip and locating differential heat generating transistors on the thermal centerline. It also is conventional to split "heat receptor" transistors into two equal, parallel-connected parts and place such parts symmetrically on opposite sides of the thermal centerline.

By way of background regarding high speed operational amplifiers, they are sensitive to high frequency noise disturbance because the internal parasitics, which would be large enough in slower amplifiers to attenuate the noise, are very much reduced and consequently allow the noise signals to pass. These amplifiers are also sensitive to high frequency noise disturbance because the high bandwidth of the active elements amplifies the noise signals.

The applications of high speed amplifiers expose them to high frequency noise disturbance coupled by stray circuit parasitics into power supply conductors and other circuit connections. The amplifiers also generate high frequency noise disturbance on internal connections as they respond to large signal high frequency input signals.

FIG. 1 is a simplified schematic diagram of an OPA646 wide bandwidth operational amplifier marketed by Burr-Brown Corporation of Tucson, Arizona which is believed to be the closest prior art to the present invention. The operational amplifier 1 of FIG. 1 includes a differential input stage 3 including NPN input transistors 4 and 5. The differential input signal is applied between the bases of input transistors 4 and 5. The emitters of input transistors 4 and 5 are connected to an NPN current mirror output transistor 6, the emitter of which is coupled through a low value resistor 7 to the negative power supply voltage $-V_{EE}$. $-V_{EE}$ typically is $-5$ volts. The collectors of input transistors 4 and 5 are coupled by load resistors 8 and 9, respectively, to the positive supply voltage $+V_{CC}$, which typically is $+5$ volts. The collectors of input transistors 4 and 5 also are coupled to the emitters of PNP "folded cascode" transistors 17 and 18 included in gain stage 19. The output 25 of gain stage 19 is coupled to the input of a diamond follower unity gain buffer 20 which produces an output $V_{OUT}$ on conductor 40.

The bases of PNP "folded cascode" transistors 17 and 18 are connected by conductor 33 to the base of PNP current mirror control transistor 15. The emitter of PNP current mirror control transistor 15 is connected through a low value resistor 28 to the positive power supply voltage $+V_{CC}$. The base of PNP current mirror control transistor 15 also is connected to the emitter of a PNP "darlington" transistor 16, the base of which is connected by conductor 21 to the collector of PNP transistor 15 and to one terminal of a current source circuit 10. (Current source 10 includes a resistor schematically drawn to represent the impedance thereof.) The "darlington" transistor 16 is needed to reduce error in the PNP current source output transistor collector currents due to the low beta of PNP transistors manufactured using typical "high speed" bipolar manufacturing processes. Conductor 21 also is connected to one terminal of a 1.5 picofarad compensation capacitor 24, the other terminal of which is connected to $+V_{CC}$. Conductor 33 also is connected to the base of a PNP current mirror output transistor 29 to establish operating current for diamond follower 20.

The collectors of PNP folded cascode transistors 17 and 18 are connected to other circuitry in gain stage circuit 19 which produces an output signal on conductor 25 that is applied to the input of diamond follower unity gain buffer 20.

An NPN current mirror control transistor 11 has its collector and base connected by conductor 22 to a second terminal of current source 10, and also to one terminal of a second compensation capacitor 23 having its other terminal connected to $V_{CC}$. Conductor 22 also is connected to the base of NPN current mirror output transistor 6 and to the base of an NPN current mirror output transistor 13 which establishes operating current for diamond follower 20. A low value resistor 12 is connected between the emitter of NPN current source control transistor 11 and $-V_{EE}$. The emitters of transistors 6 and 13 are also connected by low value resistors to $-V_{EE}$.

The base of transistor 18 is connected to the base of PNP transistor 29 which biases diamond follower 20. The emitter of transistor 29 is coupled by a resistor to $+V_{CC}$.

Those skilled in the art know that transient imbalances between the constant currents produced in the collectors of the NPN current mirror output transistors 6 and 13 and the collectors of PNP current mirror output transistors 17, 18 and 29 can produce undesirable transient signal operation of the operational amplifier 1 that results in "ringing" of the output voltage $V_{OUT}$ produced on conductor 40 when it rapidly swings or "slews" toward the $+V_{CC}$ level or the $-V_{EE}$ level. Those skilled in the art also realize that PNP "darlington" transistor 16 and PNP current mirror control transistor 15 form a loop which may oscillate at high frequencies. Therefore, compensation capacitor 24 needs to have a sufficiently high value to prevent such oscillating. In the OPA646 operational amplifier of FIG. 1, the value of the capacitance of compensation capacitor 24 is 1.5 picofarads.

Also, noise or "glitches" on the $+V_{CC}$ power supply conductor can cause imbalances in the voltages on conductors 21 and 22 by coupling unequal amounts of noise energy thereto, resulting in imbalances between the currents in the collectors of the various PNP current mirror output transistors and the currents in the collectors of the various NPN current mirror output transistors, especially if compensation capacitors 23 and 24 are mismatched. Those skilled in the art know that provision of compensation capacitors such as 23 and 24 on an integrated circuit requires much more chip area than is desirable, thereby increasing the size of the chip, increasing its cost, and sometimes decreasing its speed and manufacturing yield.

SUMMARY OF THE INVENTION

Accordingly, it is an object of the invention to provide a integrated circuit chip topography for a high speed amplifier designed to occupy substantially less chip area than the closest prior art.

It is another object of the invention to provide an integrated circuit chip topography for a bias current circuit for an operational amplifier which reduces transient imbalances in the currents in the collectors of PNP current mirror output transistors and NPN current mirror output transistors of the operational amplifier, which topography results in very low input offset voltage due to internal thermal effects during operation of the high speed operational amplifier.

Briefly described, and in accordance with one embodiment thereof, the invention provides a high speed integrated circuit operational amplifier chip including first (30L), second (30B), third (30R) and fourth (30T) successive edges. The operational amplifier chip includes a plurality of bonding pads, including an inverting input ($V_{IN}^-$) bonding pad located in a first corner formed by the first (30L) and fourth (30T) edges, a non-inverting input ($V_{IN}^+$) bonding pad located in a second corner formed by the first (30L) and second (30B) edges, a $V_{EE}$ bonding pad located in a third corner formed by the second (30B) and third (30R) edges, a $V_{CC}$ bonding pad located in a fourth corner formed by the third (30L) and fourth (30T) edges, and an output ($V_{OUT}$) bonding pad located along the third edge (30R) between the $V_{EE}$ and $V_{CC}$ bonding pads. A thermal centerline (44) parallel to the second and fourth edges divides the chip into approximately equal sections. Output driver circuitry (60) is located adjacent to the output bonding pads and is disposed approximately symmetrically about the thermal centerline so that differential heating of the operational amplifier chip by transistors in the output driver circuit is approximately symmetrical relative to the thermal centerline. A low gain differential input circuit (3) is located adjacent to the first edge (30L) and is disposed approximately symmetrically about the thermal centerline to provide approximately balanced responses of matched NPN input transistors in the low gain differential input circuit to isotherms produced by the differential heating. Transistors (17,18,38) in the low gain amplification circuit are located adjacent to the low gain differential input circuit (3) and are disposed along the thermal centerline between the low gain differential input circuit (3) and the output driver circuitry (60) to provide approximately balanced response by the low gain amplification circuit transistors to the differential heating by the output driver circuitry (60). Compensated bias current circuitry (14A), including a large compensation capacitor 45, is located along the fourth edge and adjacent to the low gain amplification circuit transistors (17,18,38) and the output driver circuitry (60).

BRIEF DESCRIPTION OF THE DRAWINGS

FIG. 5 is a scale diagram generally outlining the locations of the main sections of the circuit of FIG. 2A on the surface of an integrated circuit chip.

DETAILED DESCRIPTION OF THE PREFERRED EMBODIMENTS

Figure 1:
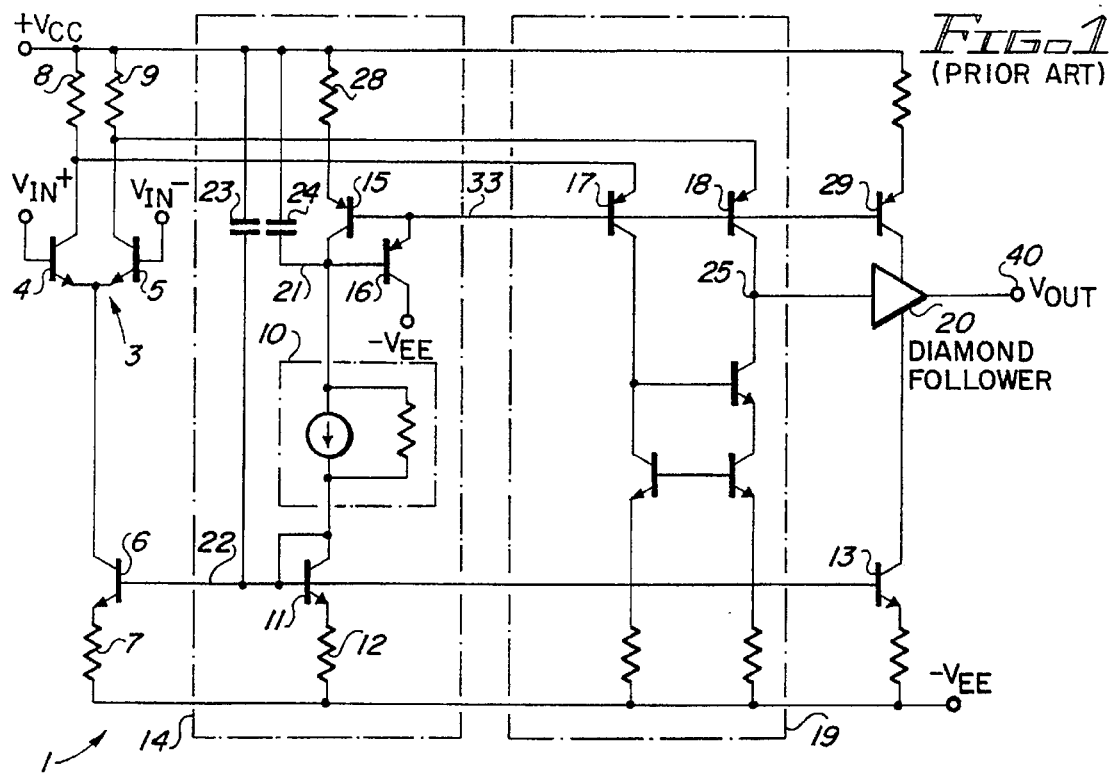
FIG. 1 is a schematic circuit diagram of an operational amplifier which constitutes the closest prior art to the present invention.
Figure 2:
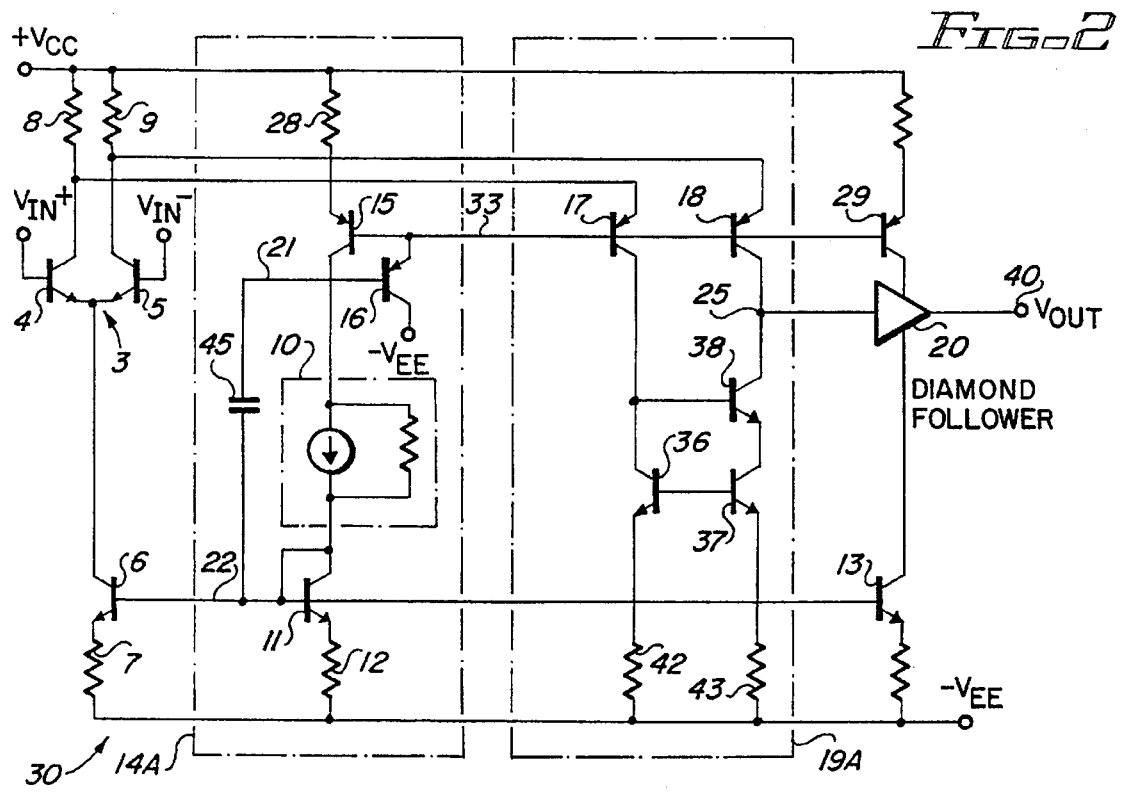
FIG. 2 is a schematic diagram of a presently preferred embodiment of the present invention.
Figure 2A:
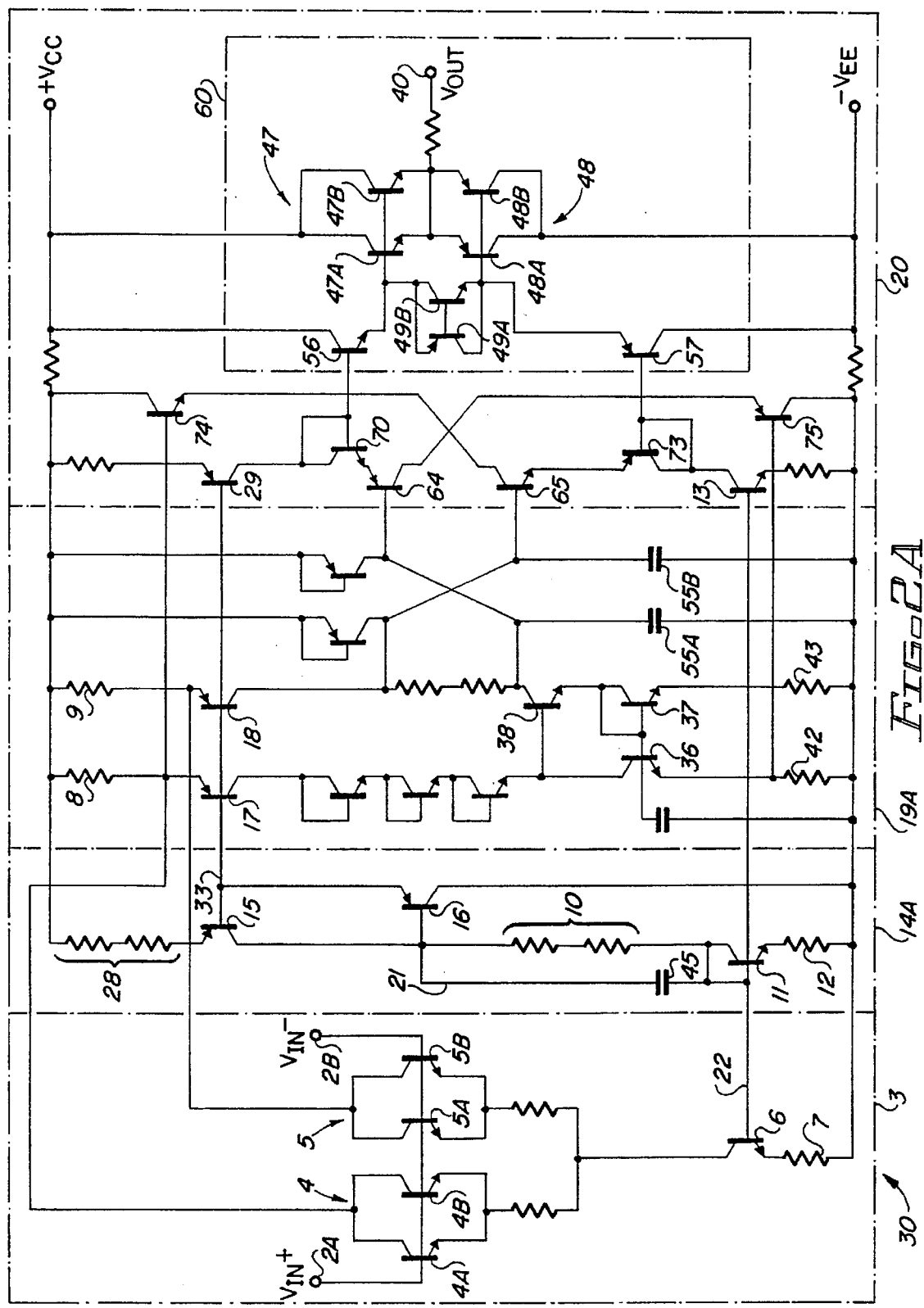
FIG. 2A is a complete detailed circuit schematic diagram of the Burr-Brown OPA650 operational amplifier shown in FIG. 2.

Before describing the topography of the present invention, which is embodied in the circuit of FIGS. 2 and 2A, it will be helpful to describe the circuit structure and operation of the operational amplifier with reference to FIGS. 2 and 2A. FIG. 2 is a simplified schematic diagram of the Burr-Brown OPA650 operational amplifier, recently introduced to the market. FIG. 2A is a detailed schematic diagram of the same circuit. In FIGS. 2 and 2A, operational amplifier 30 includes an input stage 3 that is essentially identical to differential input stage 3 of prior art FIG. 1. (Note that where suitable, the same or similar reference numerals used in FIG. 1 also are used in FIGS. 2 and 2A to identify similar or identical components.) Operational amplifier 30 also includes a bias current circuit 14A.

Bias current source circuit 14A includes a PNP current mirror control transistor 15 biased by PNP "darlington" transistor 16 in the same manner as in FIG. 1. As in FIG. 1, resistor 28 is connected between the emitter of PNP current mirror control transistor 15 and +$V_{CC}$. (However, in some cases darlington transistor 16 could be omitted.) As in FIG. 1, the collectors of NPN input transistors 4 and 5 are connected to the emitters of PNP "folded cascode" transistors 17 and 18. Two-terminal constant current source 10 (which can be a simple resistor or a more complex circuit) is connected between the collector of PNP current mirror control transistor 15 and the collector of NPN current mirror control transistor 11, as in FIG. 1.

However, 1.5 picofarad compensation capacitors 23 and 24 of prior art FIG. 1 are omitted from the operational amplifier of FIGS. 2 and 2A. Instead, and in accordance with the present invention, a compensation capacitor 45 (which can have a capacitance of 0.6 picofarads) is connected between conductor 21 and conductor 22.

In FIG. 2, numeral 19A indicates a gain circuit which, in effect, produces an output signal that is applied via conductor 25 to the bases of a pair of input transistors of a conventional diamond follower unity gain buffer circuit 20A. Since diamond follower 20A is conventional, it is not described in detail, although for completeness its schematic diagram is included in FIG. 2A.

The operational amplifier circuit 30 of the present invention requires substantially less chip area than the prior art circuit shown in FIG. 1 because the required capacitance (0.6 picofarad) of single compensation capacitor 45 is substantially less than the total 3.0 picofarads of capacitance of compensation capacitors 23 and 24 of the prior art circuit 1 of FIG. 1. In fact, even if the total capacitance of capacitors 23 and 24 of the prior art circuit of FIG. 1 could substantially reduced without seriously diminishing circuit performance, the use of the single compensation capacitor 45 is beneficial, because it results in more stable circuit operation. Furthermore, power supply "noise" or "glitches" in the operational amplifier of FIGS. 2 and 2A couple equal amounts of current into conductors 21 and 22. This results from a single compensation capacitor as in FIGS. 2 and 2A being connected to conductors 21 and 22 so as to carry the same current in both terminals, instead of having two separate capacitors as in FIG. 1, which may have different currents due to capacitance mismatches and due to differences in the impedances at conductors 21 and 22. Furthermore, feedback noise is coupled equally by single compensation capacitor 45 to the base electrodes of both PNP current mirror control transistor 15 and the NPN current mirror control transistor 11.

Therefore, approximately balanced PNP and NPN current mirror responses to such "glitches" are achieved. This can result in shorter recovery times for operational amplifier 30 of FIGS. 2 and 2A than is the case for the prior art operational amplifier 1 of FIG. 1.

Figure 3A:
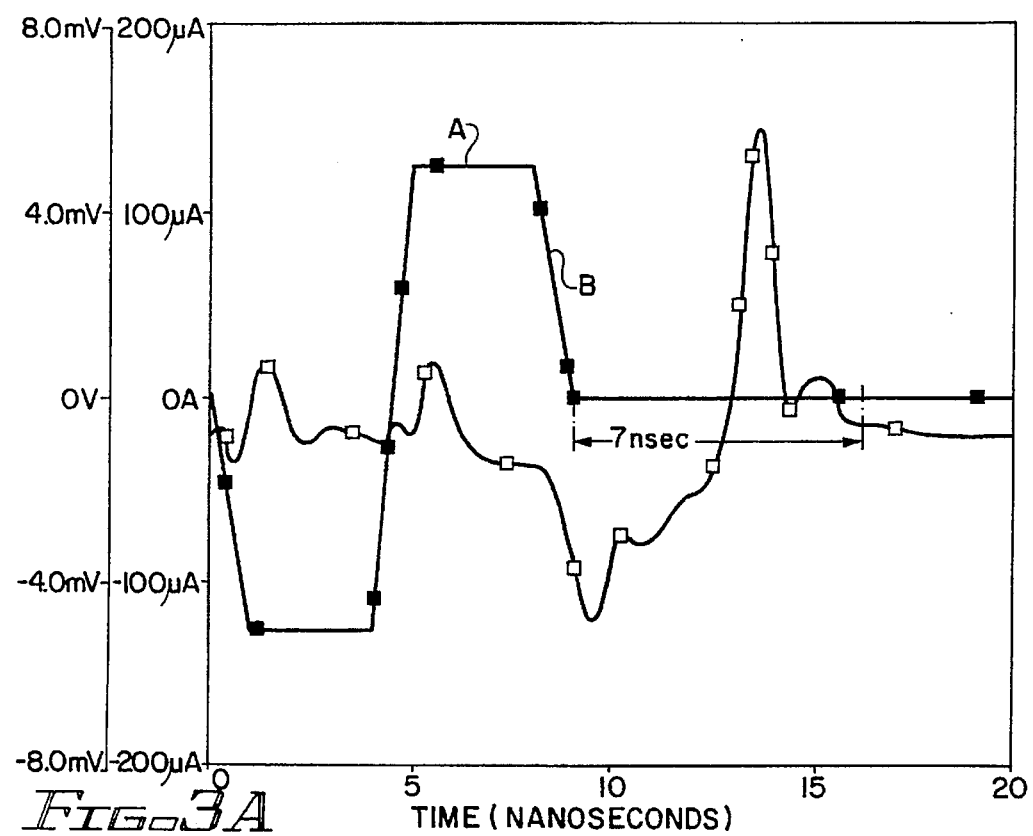
FIG. 3A is a simulated graph of $V_{OUT}$ verses time in response to ±25% perturbations in the current flowing into the conductor 33 connected to the base of PNP transistor 15 in the circuit of the present invention as shown in FIG. 2 with capacitor 45 having a capacitance of 0.6 picofarads.
Figure 3B:
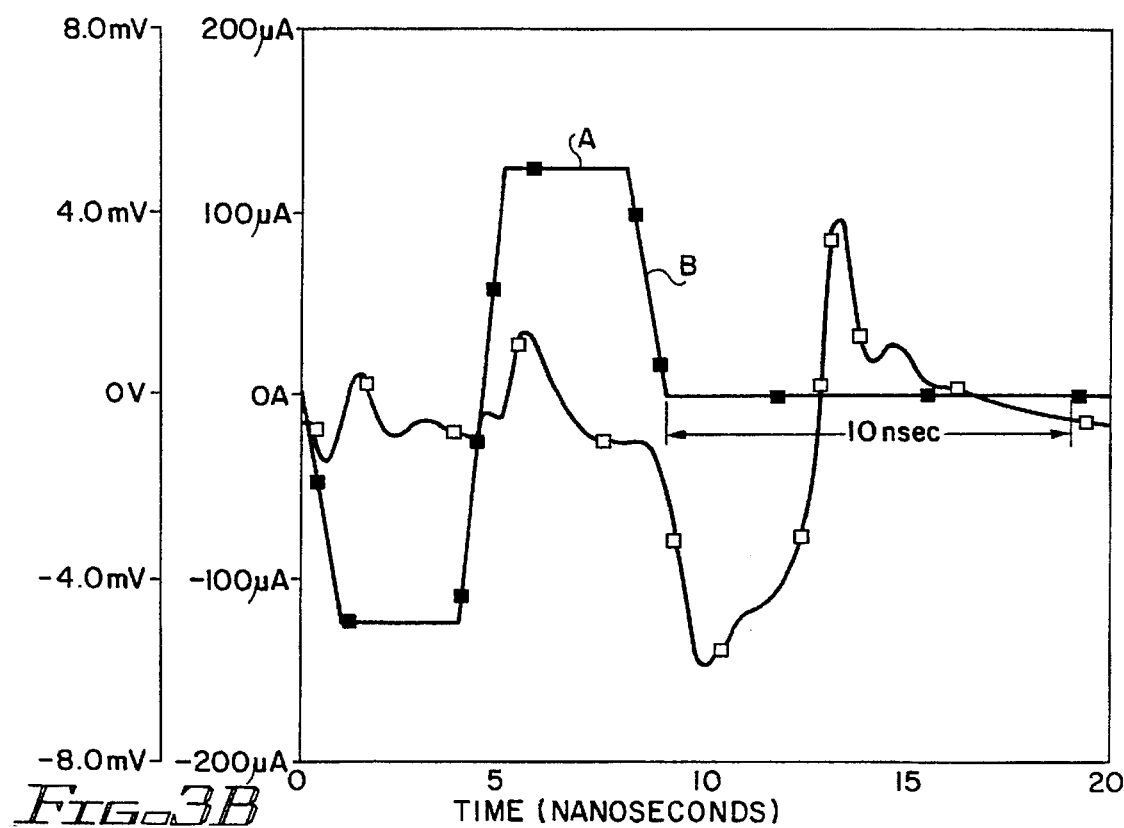
FIG. 3B is a simulated graph of $V_{OUT}$ versus time in response to ±25% perturbations in the current flowing into the conductor 33 connected to the base of PNP transistor 15 in FIG. 2 with capacitor 45 omitted and including two capacitors 23 and 24 connected as in prior art FIG. 1 each having a capacitance of 0.6 picofarads.

FIG. 3A shows a simulated graph of $V_{OUT}$ versus time for the circuit of FIGS. 2 and 2A, and FIGS. 3B and 3C show simulated graphs of $V_{OUT}$ versus time when capacitor 45 is omitted and instead the two capacitors 23 and 24 are connected as in the prior art circuit of FIG. 1. This allows a comparison between the use of the single capacitor 45 as in FIG. 2 and the use of two capacitors 23 and 24 as in prior art FIG. 1. For FIG. 3A, reference character A indicates the waveform of a simulated "noise" current source used in the computer simulation of the response of the circuit of FIG. 2 to ±25% perturbations in the current flowing into the bases of the PNP current mirror transistors. (The well known program SPICE was utilized to generate the simulated $V_{OUT}$ curves shown in FIGS. 3A–3C and 4A–4C.) The response of the circuit of FIGS. 2 and 2A to this simulated noise current source is significant because this type of noise could occur if $V_{OUT}$ on conductor 40 is slewing rapidly toward either the $+V_{CC}$ or $-V_{EE}$ voltage levels. The corresponding noise current variation on conductor 25 could be coupled by the collector-base capacitance of "folded cascode" transistor 18, causing current or charge to be "pumped" from conductor 25 into or out of conductor 33, and hence into or out of the bases of the PNP current mirror transistors. The graph of FIG. 3A shows that when the single compensation capacitor 45 is used as in FIG. 2, $V_{OUT}$ approaches a stable output level roughly 7 nanoseconds after the last noise current source transition indicated by character FIG. 3B shows the simulated $V_{OUT}$ response of the circuit of FIG. 2 to the same "noise current" source (waveform A) injected into the bases of the PNP current mirror transistors via conductor 33 when capacitor 45 is omitted and instead two compensation capacitors 23 and 24 are used as in prior art FIG. 1. It can be readily seen that $V_{OUT}$ in FIG. 3B has not settled as close as in FIG. 3A to its final level within 10 nanoseconds of the end of noise current transition B for the case when both capacitors 23 and 24 have values of 0.6 picofarads (and hence are perfectly matched).

Figure 3C:
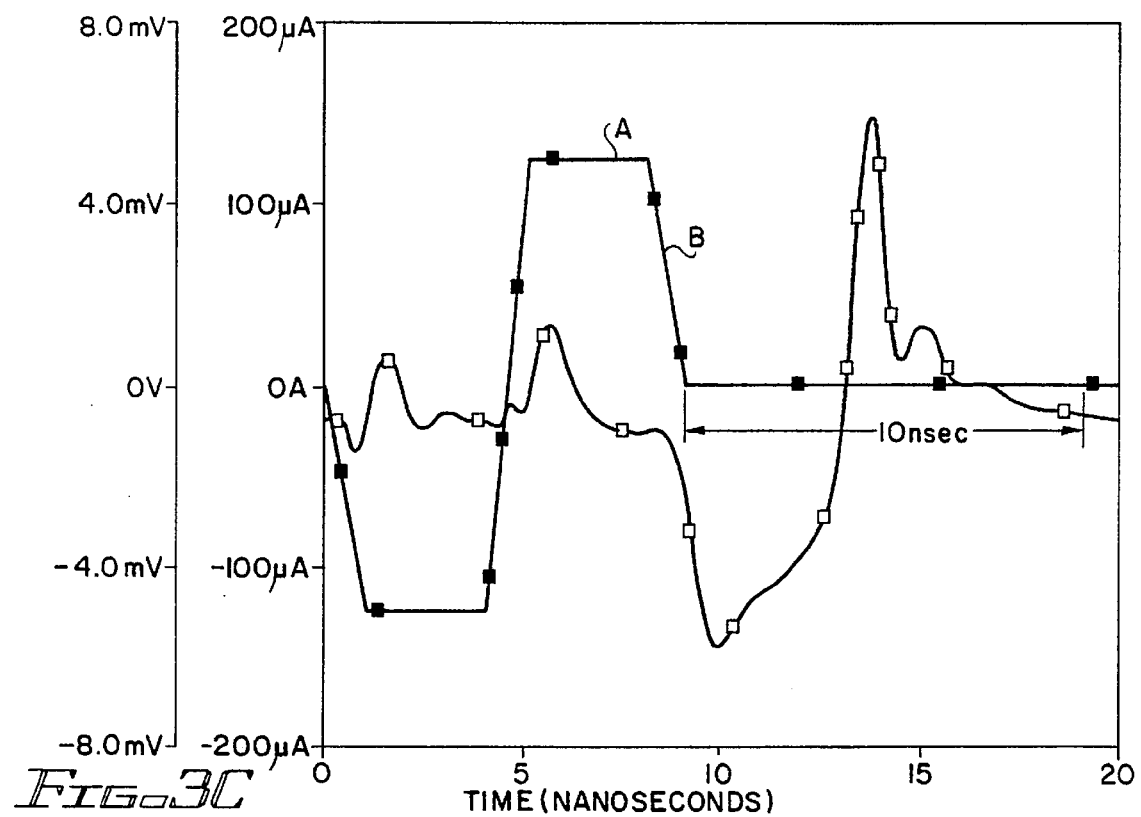
FIG. 3C is a simulated graph of $V_{OUT}$ versus time in response to ±25% perturbations in the current flowing into the conductor 33 connected to the base of PNP transistor 15 in FIG. 2 with capacitor 45 omitted and including two capacitors 23 and 24 connected as in prior art FIG. 1 each having a capacitance of 0.3 picofarads so the sum of capacitors 23 and 24 equals the value of capacitor 45.

FIG. 3C shows the simulated $V_{OUT}$ response of the circuit of FIG. 2 to the same "noise current source" (waveform A) injected into the bases of the PNP current mirror transistors via conductor 33 when capacitor 45 is omitted and instead two compensation capacitors 23 and 24 are connected as in prior art FIG. 1, wherein capacitors 23 and 24 are reduced in value to 0.3 picofarads so their sum is equal to the capacitance of the single capacitor 45 of FIG. 2 and FIG. 2A. Note that it is well known that capacitors in integrated circuits can occupy a significant part of the total chip area and that capacitor area is closely matched to the capacitance value thereof. It can be readily seen in FIG. 3C that $V_{OUT}$ has not settled as close to its final level within 10 nanoseconds of the end of noise current transition B.

Thus, the circuit of FIG. 2, with a single compensation capacitor 45, is much more stable in response to noise currents injected into or drawn out of the base of PNP current mirror control transistor 15 than the prior art circuit of FIG. 1 even if the two capacitors 23 and 24 thereof are perfectly matched. Even if capacitors 23 and 24 of the prior art circuit of FIG. 1 are reduced in value so their chip area corresponds to that of the present invention, much longer $V_{OUT}$ settling times nevertheless are required.

Figure 4A:
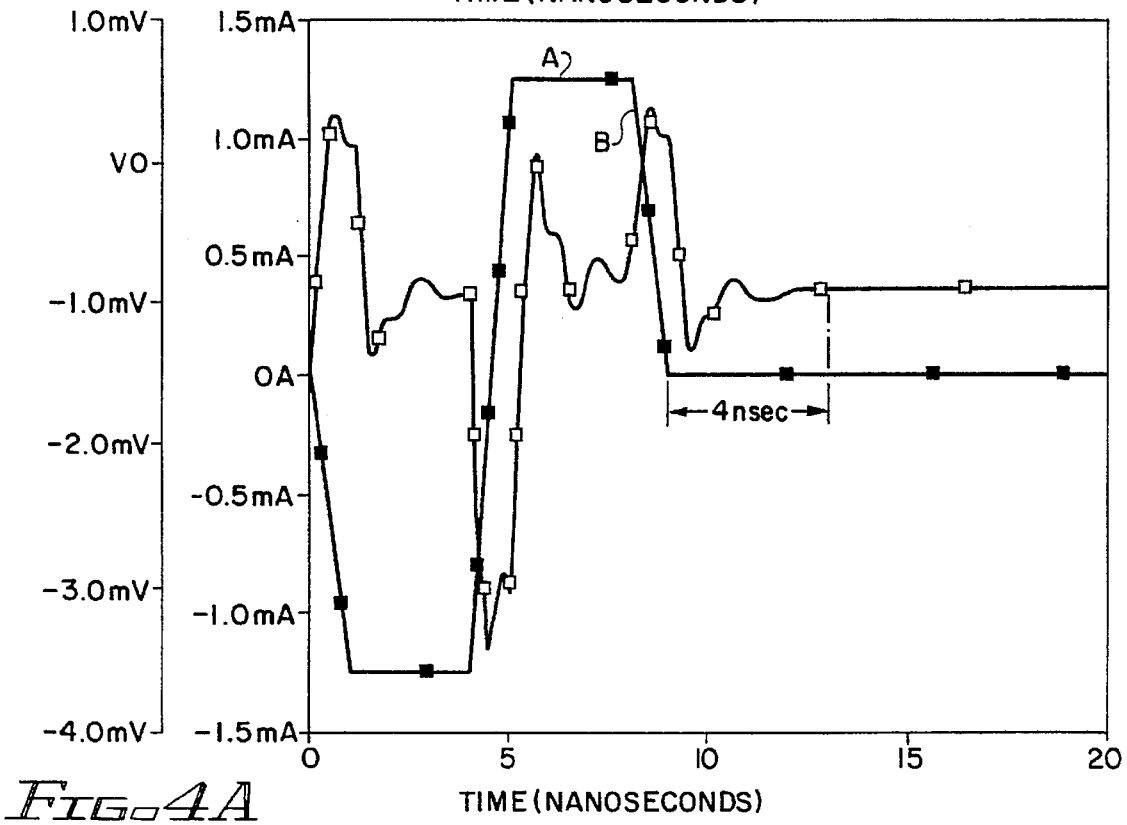
FIG. 4A is a simulated graph of $V_{OUT}$ versus time for the circuit of the present invention as shown in FIG. 2 in response to ±25% perturbations in the current flowing into the +$V_{CC}$ conductor, with capacitor 45 having a capacitance of 0.6 picofarads.
Figure 4B:
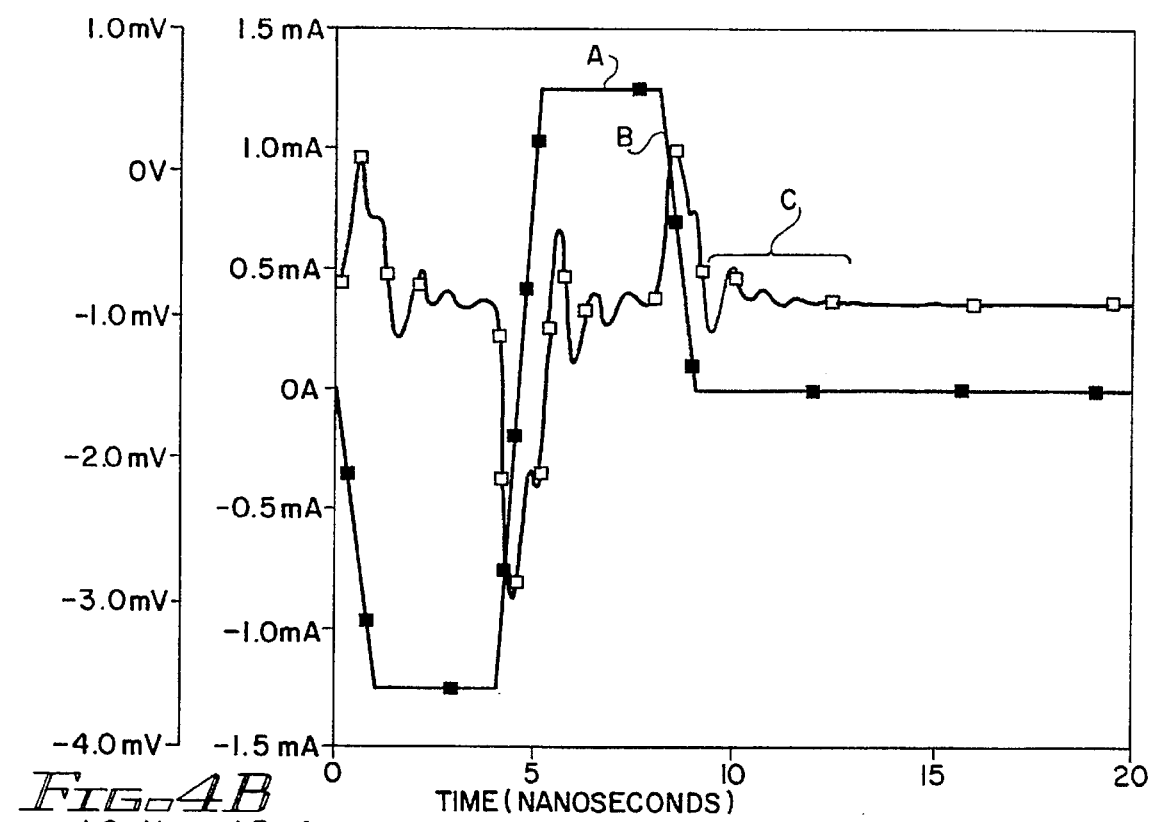
FIG. 4B is a simulated graph of $V_{OUT}$ versus time for the circuit of FIG. 2 in response to ±25% perturbation in the current flowing into the +$V_{CC}$ conductor with capacitor 45 omitted and two capacitors 23 and 24 connected as in prior art FIG. 1 each having a capacitance of 0.6 picofarads.
Figure 4C:
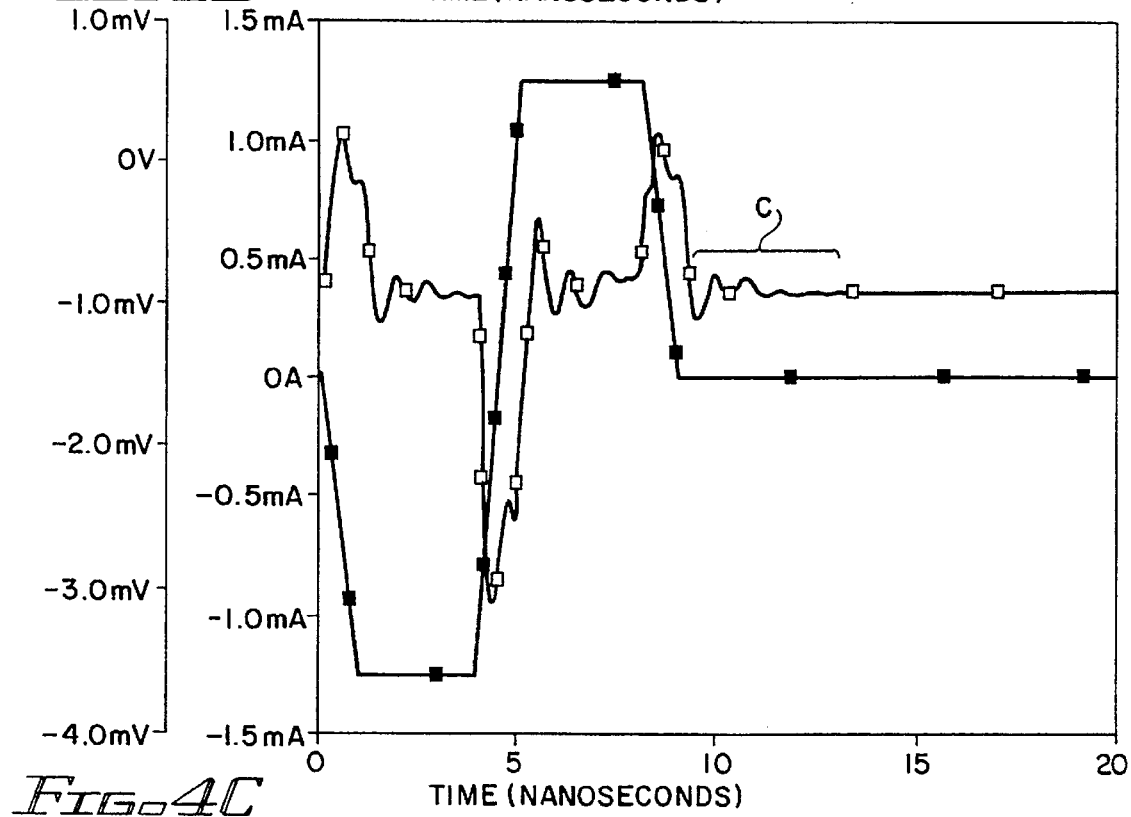
FIG. 4C is a simulated graph of $V_{OUT}$ versus time for the circuit of FIG. 2 in response to ±25% perturbations in the current flowing into the +$V_{CC}$ conductor with capacitor 45 omitted and two capacitors 23 and 24 connected as in prior art FIG. 1 each having a capacitance of 0.3 picofarads each so the sum is equal to the value of capacitor 45 of FIG. 2.

Similarly, FIG. 4A is a simulated graph of $V_{OUT}$ versus time in response to ±25% perturbations in the power supply current flowing into the $+V_{CC}$ conductor for the circuit of the present invention (FIGS. 2 and 2A). FIGS. 4B and 4C are simulated graphs of $V_{OUT}$ versus time with capacitor 45 omitted and instead two capacitors 23 and 24 are connected as in prior art FIG. 1. FIG. 4A shows $V_{OUT}$ settling close to a stable value by a time approximately 4 nanoseconds after the end of transition B of noise current waveform A, with the single compensation capacitor 45 having a capacitance of 0.6 picofarads. FIG. 4B shows that using the two compensation capacitors 23 and 24 connected as in prior art FIG. 1 (instead of compensation capacitor 45), with capacitors 23 and 24 perfectly matched at 0.6 picofarads each, results in $V_{OUT}$ being fairly stable approximately 4 nanoseconds after the end of the simulated noise current transition B. But in this case, as indicated by reference character C in FIG. 4B, $V_{OUT}$ tends to be very unstable as indicated by the three or four damped oscillation cycles. FIG. 4C shows the same tendency to instability if capacitors 23 and 24 both are reduced in value to 0.3 picofarads so their sum equals the 0.6 picofarad capacitance of single capacitor 45 of FIG. 2 (and hence occupy about the same amount of chip area).

Although the above described simulations of $V_{OUT}$ indicate about the same settling times for the particular semiconductor processing parameters used in the computer simulations, the oscillatory nature (indicated by C in FIGS. 4B and 4C) of the output of the circuit of FIG. 2 with capacitor 45 omitted and capacitors 23 and 24 of prior art FIG. 1 used instead shows that the use of two compensation capacitors 23 and 24 as in prior art FIG. 1 results in a much greater tendency to instability than the use of single compensation capacitor 45 in FIGS. 2 and 2A. Consequently, there is a much greater likelihood that temperature variations and/or variations in semiconductor processing operations could result in extended "undamped" oscillations if two compensation capacitors such as 23 and 24 in prior art FIG. 1 are used instead of a single capacitor 45 as in FIG. 2. The more stable operation shown in FIG. 4A achieved by means of the single compensation capacitor 45 of the present invention is highly desirable.

Before describing the topography of chip 30, it will be helpful to describe the structure of the diamond follower circuit 20 with reference to FIG. 2A. The rest of the circuit structure, except the "splitting" of input transistor 4 into equal sections 4A and 4B and the splitting of input transistor 5 into equal sections 5A and 5B, was described earlier with reference to FIGS. 1 and 2. Such "splitting" of differential input transistors of an operational amplifier and positioning their thermal centroid on a thermal centerline is known, as indicated earlier.

The collector of transistor 29 is connected to the base and collector of NPN level shift transistor 70 of the diamond follower output circuit which includes transistors 29, 70, 64, 65, 73, 13, 75, 56, 49A, 49B, 57, 47 and 48. Transistors 56, 57, 49A, 49B, 47, and 48 are located in area 60 in FIGS. 5 and 6. The emitter of level shift transistor 70 is connected to the emitter of diamond follower PNP input transistor 64. The collector of transistor 64 is connected to the emitter of PNP transistor 75, the base of which is connected to the emitter of NPN current mirror output transistor 36. The collector of transistor 75 is connected to $-V_{EE}$.

Diamond follower NPN input transistor 65 has a collector connected to the emitter of NPN transistor 74, the collector of which is connected to $+V_{CC}$ and the base of which is connected to the emitter of transistor 17. The emitter of diamond follower input transistor 65 is connected to the emitter of PNP level shift transistor 73, the base and collector of which are connected to the base of PNP transistor 57 and to the collector of NPN transistor 13. The emitter of transistor 13 is connected by a resistor to $-V_{EE}$.

The collector of transistor 18 is connected to the base of diamond follower input transistor 65, and the collector of transistor 38 is connected to the base of diamond follower input transistor 64. The collector of transistor 38 is connected to the base of diamond follower input transistor 64 and is coupled by a pair of series-connected resistors to the collector of transistor 18. Transistor 38 is a cascode transistor having its base coupled by three series-connected diodes to the collector of transistor 17 and its emitter connected to the base and collector of NPN current mirror transistor 37 and to the base of NPN current mirror transistor 36. The collector of transistor 36 is connected to the base of transistor 38.

NPN output driver bias transistor 56 has its collector connected to $+V_{CC}$, its base connected to the base of transistor 70, and its emitter connected to the collector of NPN transistor 49B, the emitter of PNP transistor 49A, and the base of NPN output transistor 47, which is "split" into identical parallel-connected sections 47A and 47B, the collectors of which are connected to $+V_{CC}$. The emitters of NPN output transistor sections 47A and 47B are coupled by a low value resistor to the $V_{OUT}$ bonding pad or terminal 40.

PNP output drive bias transistor 57 has its collector connected to $-V_{EE}$, its base connected to the base of transistor 73, and its emitter connected to the emitter of NPN transistor 49B and the collector of PNP transistor 49A, the bases of which are connected together. The emitter of transistor 57 also is connected to the base of PNP output transistor 48, which is "split" into identical parallel-connected sections 48A and 48B, the emitters of which are coupled by the above mentioned low value resistor to $V_{OUT}$ terminal 40 and the collectors of which are connected to $-V_{EE}$.

Figure 6:
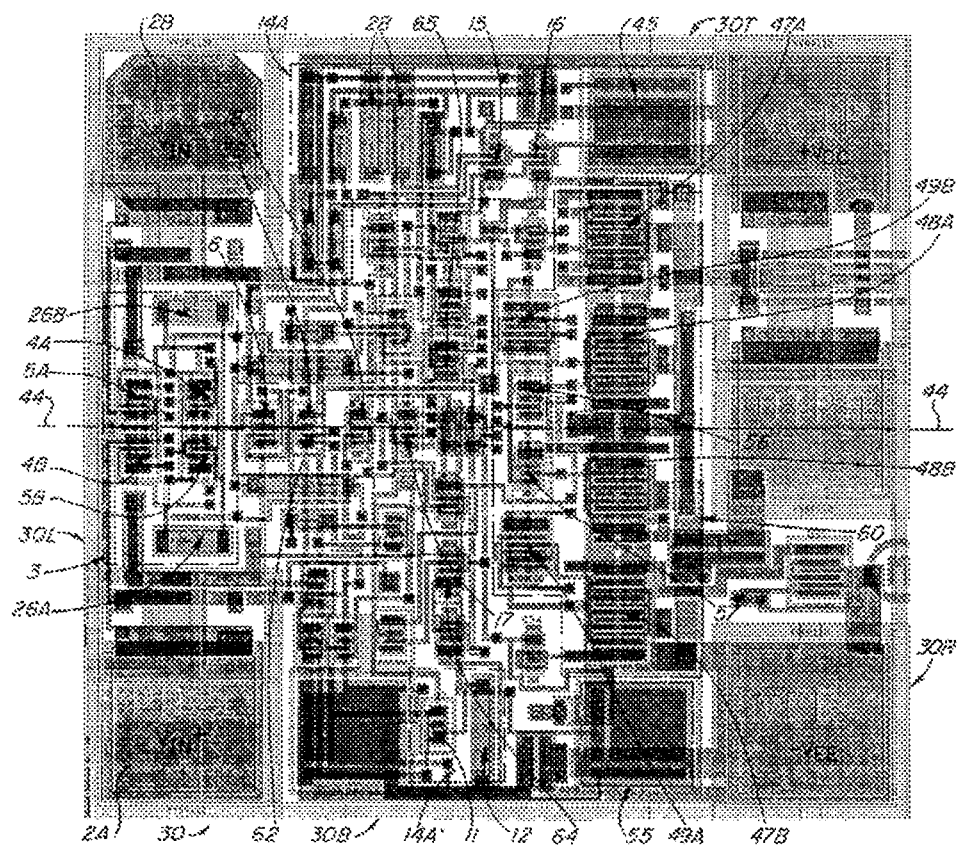
FIG. 6 is a scale diagram showing the section of FIG. 5 superimposed on a "composite" printout of several of the mask layers utilized in fabricating the integrated circuit operational amplifier of FIG. 2A.

Referring now to FIGS. 5 and 6, high speed operational amplifier chip 30 includes left, right, top, and bottom edges 30L, 30R, 30T, and 30B, respectively. A horizontal thermal centerline 44 is preestablished so that it "bisects" chip 30 into approximately equal size upper and lower sections. $V_{IN}^-$ bonding pad 2B is located in the upper left corner of chip 30 as it appears in FIG. 5. The $V_{IN}^+$ bonding pad 2A is located in the lower left corner of chip 30. The $+V_{CC}$ bonding pad is located in the upper right corner, and the $-V_{EE}$ bonding pad is located in the lower right corner. $V_{OUT}$ bonding pad 40 is located midway between the $+V_{CC}$ and $-V_{EE}$ bonding pads adjacent to right edge 30R. The sequence of bonding pad locations and their sizes, which are drawn to scale in FIGS. 5 and 6, is determined primarily by the standardized lead locations for $V_{IN}^-$, $V_{IN}^+$, $+V_{CC}$, $V_{OUT}$, and $-V_{EE}$ for standard operational amplifiers. The locations of the circuit elements are confined to the remaining area of the chip.

As indicated in FIG. 6, reference numeral 3 indicates the area in which input transistors 4A, 4B, 5A, and 5B, and emitter resistors 26A and 26B are located. Transistors 6, 38, 18, 17, 36, and 37 are located in area 62 with their thermal centroids located on thermal centerline 44. NPN output transistors 47A and 47B are located symmetrically about thermal centerline 44 in area 60, as indicated in FIG. 6. Similarly, PNP output transistors 48A and 48B are located in area 60 symmetrically above and below thermal centerline. PNP transistor 49A and NPN transistor 49B connected as shown in FIG. 2A are located in area 60 symmetrically above and below thermal centerline 44. NPN transistor 56 and PNP transistor 57 similarly are located in area 60 symmetrically above and below thermal centerline 44.

The transistors located in areas 3 and 62 in FIGS. 5 and 6 include the differential NPN input transistors 4A, B and 5A, B and the various transistors forming low-gain circuitry in the signal path; these are the transistors which are most significantly affected by unbalanced differential heating in the chip. The transistors located in area 60 in FIG. 5 are the transistors which during operation produce the most significant and substantial differential heating and are located to produce symmetrical isotherms.

The above mentioned considerations for good thermal design necessitated finding an arrangement consistent with the circuit diagram of FIG. 2A which would also achieve good thermal design. The arrangement of FIGS. 5 and 6 accomplishes that with respect to areas 3, 62, and 60, and leaves the rest of the chip surface area for placement of the other circuit components of high speed operational amplifier 30 of FIG. 2A. The above described bias circuitry, including current source resistors 10, resistors 28, PNP current mirror control transistor 15, PNP darlington transistor 16, and compensation capacitor 45 are located in the area 14A of FIGS. 5 and 6. NPN current mirror control transistor 11 and its emitter resistor 12 are located in area 14A'. Compensation capacitors 55A and 55B of FIG. 2A are located generally in area 55 in FIGS. 5 and 6.

Conductor routing considerations and the large size of compensation capacitor 45 led to positioning of the bias current circuitry 14A of FIG. 2A, including capacitor 45, within area 14A without the need to increase either the length or width of chip 30. This was made possible by the previously described circuit design which avoided the need to use two compensation capacitors 23 and 24 as in prior art FIG. 1.

For the layout of FIGS. 5 and 6, the sizes of and minimum spacings between input bonding pads 2A and 2B, output bonding pad 40, and the $+V_{CC}$ and $-V_{EE}$ bonding pads and the placement of such bonding pads within "allowed sectors", and also the fact that integrated circuit operational amplifiers have standard package lead locations, constituted an initial set of layout design constraints. These constraints led to the location of input stage 3 near left edge 30L and diamond follower output stage 20 close to the right edge 30R.

Input transistors 4A, B and 5A, B were split into a conventional "cross-coupled quad". A horizontal thermal center line 44 was established for chip 30, and the thermal centroid of the cross-coupled quad 4A, B and 5A, B was positioned on thermal centerline 44, as close as possible to the left edge 30L. The splitting of the output stage PNP transistor 47 into transistors 47A and 47B and also the splitting of NPN transistor 48 into transistors 48A and 48B, and positioning them symmetrically about and aligned with a line perpendicular to the thermal centerline 44 as indicated in FIG. 6, is not conventional, and a considerable amount of effort was required to arrive at these aspects of the illustrated layout.

Note that the folded cascode transistors 17 and 18 also are sensitive relative to thermal perturbations in the operational amplifier topography of FIG. 5 because there is no voltage gain in these transistors, as is the case in more conventional operational amplifier input stage designs.

An important tradeoff in the design of the output stage including transistors 47A, B, 48A, B, and 49A and 49B is whether the extra chip area required to symmetrically "split" these transistors and route the additional conductors necessary to accomplish this to the symmetrical opposed locations about thermal centerline 44 would be worth the benefits of avoiding differential heating effects on the sensitive transistors in the signal path, namely input transistors 4A, B, 5A, B, 6, 38, 36, 37 and folded cascode transistors 17 and 18, all of which propagate very low level analog signals representative of the applied differential input voltage.

Diamond follower input transistors 64 and 65 undergo large collector voltage swings, and therefore can act as differential heat generators. They are located as symmetrically as practical about thermal centerline 44. Current mirror transistors 36 and 37 usually also are significant differential heat generators, because their collectors undergo large voltage swings, and to the extent possible are symmetrically located about thermal centerline 44.

The placement of the above indicated transistors in output stage 20 in area 60 of FIGS. 5 and 6 resulted in a large amount of available space in the upper and lower right hand corners of chip 30. This was convenient for location of the several large compensation capacitors of operational amplifier chip 30, because such compensation capacitors, which consist of metal-oxide-silicon structures, are very insensitive to differential temperature variations. The placement of the remaining transistors in operational amplifier 30 was generally dictated by localized conductor routing considerations and presented no more than ordinary difficulty to the layout designer.

The five bonding pads are located symmetrically with respect to thermal centerline 44 because they and their respective bonding wires, which are connected to corresponding package leads constitute significant heat sinks for chip 60. Consequently, the symmetrical bonding pad locations improve the symmetry of the isotherms produced in chip 60.

The above topography results in a chip size of 700 microns by 670 microns, with excellent high frequency performance, low offset voltage and current, and improved low frequency linearity and open loop transimpedance.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A high speed integrated circuit operational amplifier chip including first, second, third and fourth edges, the operational amplifier chip comprising in combination:

(a) a plurality of bonding pads, including an inverting input bonding pad located in a first corner formed by the first and fourth edges, a non-inverting input bonding pad located in a second corner formed by the first and second edges, a $V_{EE}$ bonding pad located in a third corner formed by the second and third edges, a $V_{CC}$ bonding pad located in a fourth corner formed by the third and fourth edges, and an output bonding pad located along the third edge between the $V_{EE}$ and $V_{CC}$ bonding pads approximately equal size first and second half sections of the operational amplifier chip being located on opposite sides of a thermal centerline parallel to the second and fourth edges;

(b) an output driver circuit located adjacent to the output bonding pad and disposed approximately symmetrically about the thermal centerline to provide approximately balanced differential heating of the operational amplifier chip relative to the thermal centerline, wherein the output driver circuit includes first and second parallel-connected NPN output transistors and first and second parallel-connected PNP output transistors, the first and second PNP output transistors being symmetrically disposed immediately adjacent to and on opposite sides of the thermal centerline, the first and second NPN output transistors being disposed symmetrically about the thermal centerline immediately adjacent to the first and second PNP output transistors, respectively;

(c) a low gain differential input circuit located adjacent to the first edge and disposed approximately symmetrically about the thermal centerline to provide approximately balanced responses of various matched transistors in the low gain differential input circuit to isotherms produced by the differential heating;

(d) a plurality of low gain amplification circuit transistors located adjacent to the low gain differential input circuit and disposed along the thermal centerline between the low gain differential input circuit and the output driver circuit to provide approximately balanced response to the low gain amplification circuit transistors to differential heating by the output driver circuit; and (e) compensated bias current circuitry located along the fourth edge and adjacent to the low gain amplification circuit transistors and the output driver circuit.

2. The high speed integrated circuit operational amplifier chip of claim 1 wherein the output driver circuit includes an NPN bias current transistor and a PNP bias current transistor adjacent to the first and second PNP output transistors, respectively, and symmetrically disposed adjacent to and on opposite sides of the thermal centerline.

3. The high speed integrated circuit operational amplifier chip of claim 2 wherein the output driver circuit includes a PNP bias transistor adjacent to the PNP bias current transistor and an NPN bias transistor adjacent to the NPN bias current transistor, the PNP bias transistor and the NPN bias transistor being disposed symmetrically about the thermal centerline.

4. The high speed integrated circuit operational amplifier chip of claim 1 wherein the low gain differential input circuit includes parallel-connected first and second NPN input transistors constituting a first pair and parallel-connected third and fourth NPN input transistors constituting a second pair, the first and third NPN input transistors being adjacent to each other and disposed adjacent to and on a first side of the thermal centerline, the second and fourth NPN input transistors being adjacent to each other and disposed adjacent to and on a second side of the thermal centerline.

5. The high speed integrated circuit operational amplifier chip of claim 4 wherein the plurality of low gain amplification circuit transistors include a constant current source transistor having a collector coupled to the emitters of the first, second, third, and fourth NPN input transistors.

6. The high speed integrated circuit operational amplifier chip of claim 5 wherein the plurality of low gain amplification circuit transistors include first and second PNP cascode transistors, an emitter of the first PNP cascode transistor being coupled to collectors of the first and second NPN input transistors, an emitter of the second PNP cascode transistor being coupled to collectors of the third and fourth NPN input transistors, a collector of the NPN cascode transistor being coupled to a collector of the second PNP cascode transistor and to an input of the output driver circuit, the second PNP cascode transistor being disposed on the thermal centerline and adjacent to the first PNP cascode transistor.

7. The high speed integrated circuit operational amplifier chip of claim 1 wherein the inverting input bonding pad and the non-inverting input bonding pad are symmetrically disposed about the thermal centerline and the $V_{CC}$ bonding pad and the $V_{EE}$ bonding pad are symmetrically disposed about the thermal centerline.

8. The high speed integrated circuit operational amplifier chip of claim 7 wherein the output bonding pad is symmetrically disposed on the thermal centerline.

9. A high speed integrated circuit operational amplifier chip including sequential first, second, third and fourth edges, the operational amplifier chip comprising in combination:

(a) approximately equal size first and second half sections of the operational amplifier chip located on opposite sides of a stationary thermal centerline parallel to the second and fourth edges;

(b) an output driver circuit located adjacent to the third edge and disposed approximately symmetrically about the thermal centerline to provide approximately balanced differential heating of the operational amplifier chip relative to the thermal centerline, wherein the output driver circuit includes first and second parallel-connected NPN output transistors and first and second parallel-connected PNP output transistors, the first and second PNP output transistors being symmetrically disposed immediately adjacent to and on opposite sides of the thermal centerline, the first and second NPN output transistors being disposed symmetrically about the thermal centerline immediately adjacent to the first and second PNP output transistors, respectively;

(c) a low gain differential input circuit disposed generally in a left half of the operational amplifier chip bounded by the first edge approximately symmetrically about the thermal centerline to provide approximately balanced responses of various matched transistors in the low gain differential input circuit to isotherms produced by the differential heating; and (d) a plurality of low gain amplification circuit transistors located between the low gain differential input circuit and the output driver circuit and disposed along the thermal centerline to provide approximately balanced response to the low gain amplification circuit transistors to differential heating by the output driver circuit.

10. The high speed integrated circuit operational amplifier chip of claim 9 wherein the output driver circuit includes an NPN bias current transistor and a PNP bias current transistor disposed adjacent to and on opposite sides of the thermal centerline.

11. The high speed integrated circuit operational amplifier chip of claim 10 wherein the output driver circuit includes a PNP bias transistor adjacent to the PNP bias current transistor and an NPN bias transistor adjacent to the NPN bias current transistor, the PNP bias transistor and the NPN bias transistor being disposed symmetrically about the thermal centerline.

12. The high speed integrated circuit operational amplifier chip of claim 9 wherein the low gain differential input circuit includes a parallel-connected first and second NPN input transistors constituting a first pair and parallel-connected third and fourth NPN input transistors constituting a second pair, the first and third NPN input transistors being adjacent to each other and disposed adjacent to and on a first side of the thermal centerline, the second and fourth NPN input transistors being adjacent to each other and disposed adjacent to and on a second side of the thermal centerline.

13. The high speed integrated circuit operational amplifier chip of claim 12 wherein the plurality of low gain amplification circuit transistors include a constant current source transistor having a collector coupled to the emitters of the first, second, third, and fourth NPN input transistors.

14. The high speed integrated circuit operational amplifier chip of claim 13 wherein the plurality of low gain amplification circuit transistors include first and second PNP cascode transistors, an emitter of the first PNP cascode transistor being coupled to collectors of the first and second NPN input transistors, an emitter of the second PNP cascode transistor being coupled to collectors of the third and fourth NPN input transistors, a collector of the NPN cascode transistor being coupled to a collector of the second PNP cascode transistor and to an input of the output driver circuit, the first PNP cascode transistor being located close to the second PNP cascode so as to cause the first PNP cascode transistor to be effectively heated by the second PNP cascode transistor, the second PNP cascode transistor being located close to the thermal centerline so its differential heating will symmetrically affect other transistors of the operational amplifier chip which are symmetrically positioned with respect to the thermal centerline.

* * * * *